United States Patent
Tanaka

(10) Patent No.: US 11,064,639 B2
(45) Date of Patent: Jul. 13, 2021

(54) OPERATION MACHINE TO CONTROL HOLDING HEAD

(71) Applicant: FUJI CORPORATION, Chiryu (JP)

(72) Inventor: Katsunori Tanaka, Kasugai (JP)

(73) Assignee: FUJI CORPORATION, Chiryu (JP)

( * ) Notice: Subject to any disclaimer, the term of this patent is extended or adjusted under 35 U.S.C. 154(b) by 76 days.

(21) Appl. No.: 16/462,608

(22) PCT Filed: Dec. 1, 2016

(86) PCT No.: PCT/JP2016/085693
§ 371 (c)(1),
(2) Date: May 21, 2019

(87) PCT Pub. No.: WO2018/100706
PCT Pub. Date: Jun. 7, 2018

(65) Prior Publication Data
US 2020/0068755 A1     Feb. 27, 2020

(51) Int. Cl.
| H05K 13/04 | (2006.01) |
| G06T 7/73 | (2017.01) |
| H05K 13/08 | (2006.01) |
| G06T 7/00 | (2017.01) |

(52) U.S. Cl.
CPC ....... *H05K 13/0404* (2013.01); *G06T 7/0004* (2013.01); *G06T 7/73* (2017.01); *H05K 13/0813* (2018.08); *G06T 2207/30141* (2013.01)

(58) Field of Classification Search
CPC .......... H05K 13/0404; H05K 13/0813; H05K 13/0812; H05K 13/04; G06T 2207/30141; G06T 7/0004; G06T 7/73
See application file for complete search history.

(56) References Cited

U.S. PATENT DOCUMENTS

| 2002/0136443 A1* | 9/2002 | Chi ................... H05K 13/0813 382/151 |
| 2015/0128411 A1 | 5/2015 | Watanabe et al. |
| 2016/0198601 A1* | 7/2016 | Maeda ............... H05K 13/0812 29/739 |

FOREIGN PATENT DOCUMENTS

| EP | 3 032 932 A1 | 6/2016 |
| JP | 5-75296 A | 3/1993 |
| JP | 2002-280799 A | 9/2002 |
| JP | 4145615 B2 | 9/2008 |
| JP | 2015-95575 A | 5/2015 |

OTHER PUBLICATIONS

International Search report dated Mar. 7, 2017 in PCT/JP2016/085693 filed Dec. 1, 2016.

* cited by examiner

*Primary Examiner* — Marcos L Torres
(74) *Attorney, Agent, or Firm* — Oblon, McClelland, Maier & Neustadt, L.L.P.

(57) ABSTRACT

In a component mounter including a component holding tool configured to hold lead of a lead component, a position of mark given to the component holding tool and a position of a distal end of the lead are calculated based on captured image data, and when a distance between the position of the mark and the position of the distal end of the lead is smaller than a threshold, mounting work is performed, whereas when the distance is equal to or greater than the threshold, the mounting work is not performed. As a result, for example, mounting work on a lead component having a lead which is greatly bent can be avoided, thereby ensuring proper mounting work.

9 Claims, 18 Drawing Sheets

OPERATION MACHINE TO CONTROL HOLDING HEAD

TECHNICAL FIELD

The present application relates to an operation machine for performing insertion work of inserting a lead of a lead component held by a holding tool into a through hole formed in a board.

BACKGROUND ART

Some operation machines include a holding tool for holding a lead component, comprised of a lead and a body, and perform insertion work of inserting a lead of a lead component held by the holding tool into a through hole formed in a board. Patent Literature below describes an example of such an operation machine.

PATENT LITERATURE

Patent Literature 1: Japanese Patent No. 4145615

TECHNICAL PROBLEM

In the operation machine configured as described above, it is desirable to mount lead components properly. The present disclosure has been made in view of such a situation, and a problem that the present disclosure is to solve is that of mounting lead components properly.

BRIEF SUMMARY

Solution to Problem

To solve the problem, according to the description, there is provided an operation machine including: a holding head including a holding tool configured to hold a lead component comprised of a lead and a body; a moving device configured to move the holding head; a first acquisition section configured to acquire a distal end position of the lead of the lead component held by the holding tool; a second acquisition section configured to acquire at least one of a position of the holding tool holding the lead of the lead component and a position of the body of the lead component held by the holding tool; and a control device configured to control operations of the holding head and the moving device to perform insertion work of inserting the lead of the lead component held by the holding tool into a through hole formed in a board when a distance between a position acquired by the first acquisition section and a position acquired by the second acquisition section is smaller than a threshold and not to perform the insertion work when the distance is equal to or greater than the threshold.

Advantageous Effects

According to the disclosure, the mounting work is performed when the distance between at least one of the position of the holding tool holding the lead and the position of the body of the lead component held by the holding tool and the position of the distal end of the lead is relatively small, whereas when the distance is relatively great, the mounting work is not performed. As a result, only lead components which can ensure proper mounting are mounted, thereby enabling the proper mounting of lead components.

DESCRIPTION OF EMBODIMENTS

Hereinafter, referring to drawings, as a mode for carrying out the present disclosure, embodiments of the present disclosure will be described in detail.

First Embodiment (A) Configuration of Component Mounter

Figure 1:
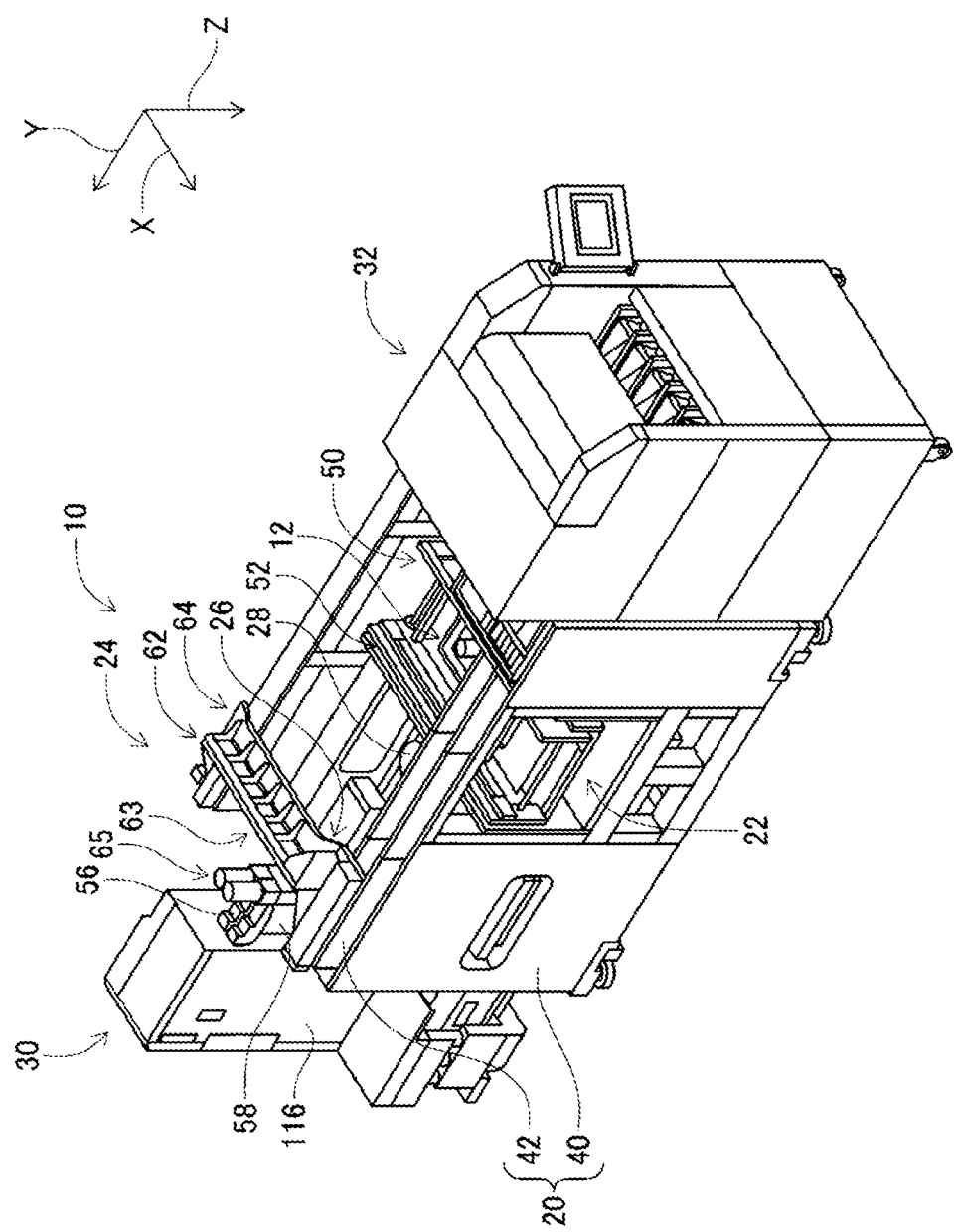
FIG. 1 is a perspective view showing a component mounter.

FIG. 1 shows component mounter 10. Component mounter 10 is a device for performing component mounting work on circuit substrate 12. Component mounter 10 includes device main body 20, substrate conveyance and holding device 22, component mounting device 24, mark camera 26, part camera 28, component supply device 30, bulk component supply device 32, and control device (refer to FIG. 8) 36. Circuit substrate 12 may be a circuit board, a substrate of a three-dimensional structure, and the like, and a circuit board may be a printed wiring board, a printed circuit board, and the like.

Device main body 20 is comprised of frame section 40 and beam section 42 mounted over frame section 40. Substrate conveyance and holding device 22 is disposed at a center of frame section 40 in a front-rear direction thereof and includes conveyance device 50 and clamping device 52. Conveyance device 50 is a device configured to convey circuit substrate 12, and clamping device 52 is a device configured to hold circuit substrate 12. As a result, substrate conveyance and holding device 22 conveys circuit substrate 12 and fixedly holds circuit substrate 12 in a predetermined position. In the following description, a direction in which circuit substrate 12 is conveyed is referred to as an X-direction, a horizontal direction perpendicular to that direction is referred to as a Y-direction, and a vertical direction is referred to as a Z-direction. That is, a width direction of component mounter 10 is the X-direction, and a longitudinal or front-rear direction thereof is the Y-direction.

Component mounting device 24 is disposed on beam section 42 and includes two work heads 56, 58 and work head moving device 62. Work head moving device 62 is comprised of X-direction moving device 63, Y-direction moving device 64, and Z-direction moving device 65. X-direction moving device 63 and Y-direction moving device 64 include electromagnetic motors (refer to FIG. 8) 66, 68, respectively, whereby two work heads 56, 58 are integrally moved to any positions on frame section 40 by corresponding electromagnetic motors 66, 68. Z-direction moving device 65 includes electromagnetic motors (refer to FIG. 8) 70, 72, whereby sliders 74, 76 are individually moved in an up-down direction by corresponding electromagnetic motors 70, 72. Work heads 56, 58 are detachably mounted on sliders 74, 76, respectively. As a result, work heads 56, 58 are individually moved in the up-down direction by Z-direction moving device 65.

Figure 2:
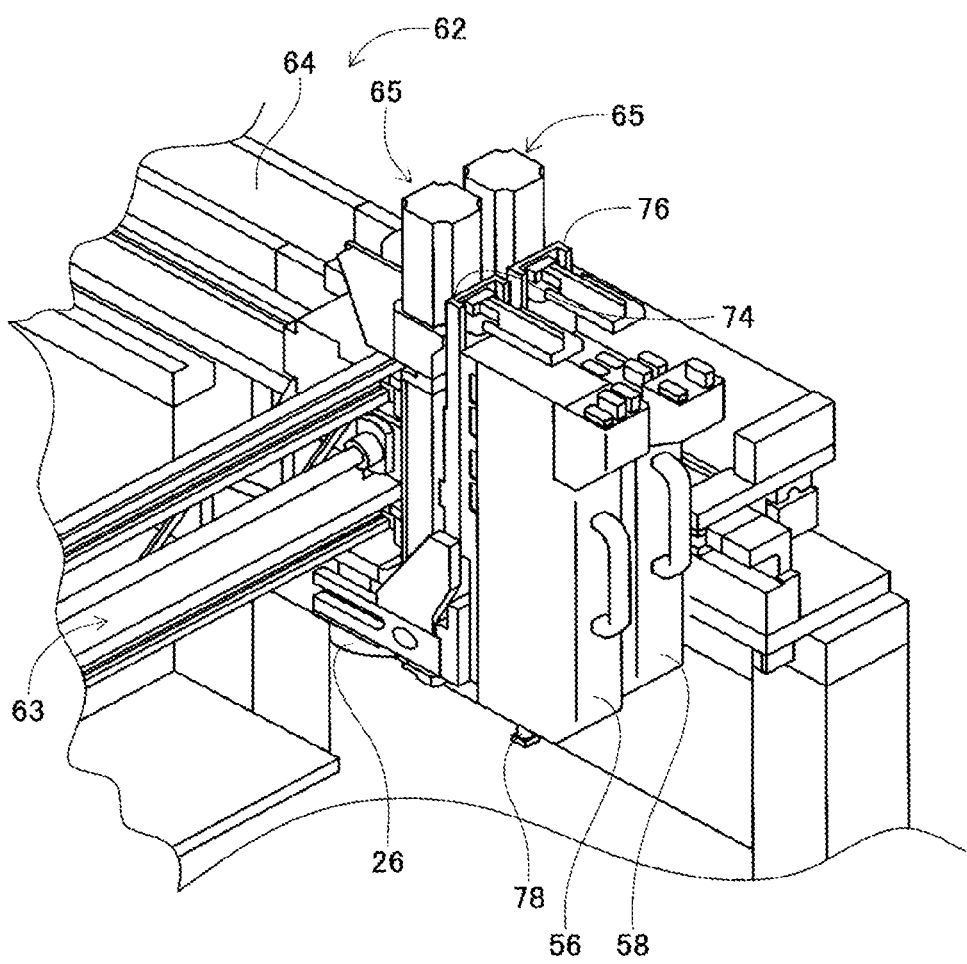
FIG. 2 is a perspective view showing a component mounting device of the component mounter.
Figure 3:
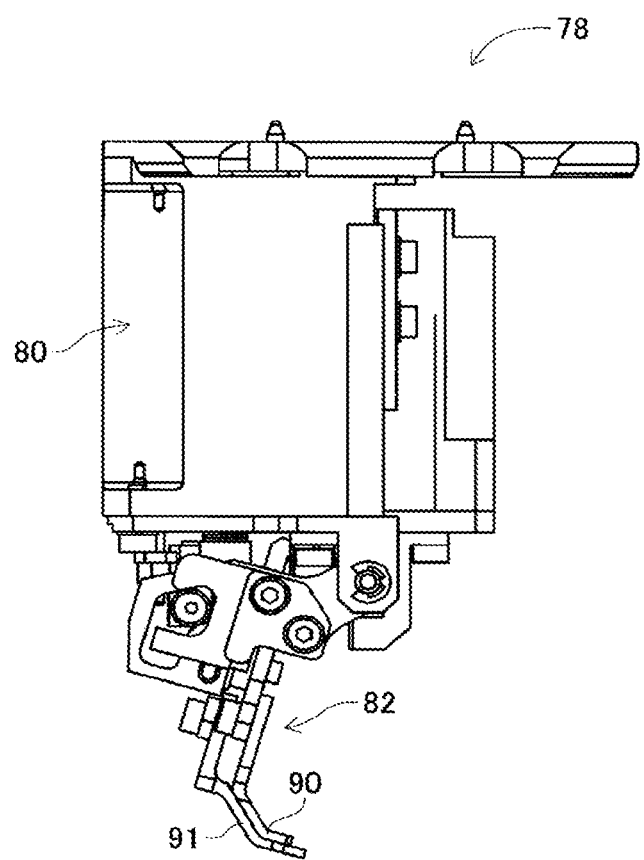
FIG. 3 is a side view showing a component holding tool.
Figure 4:
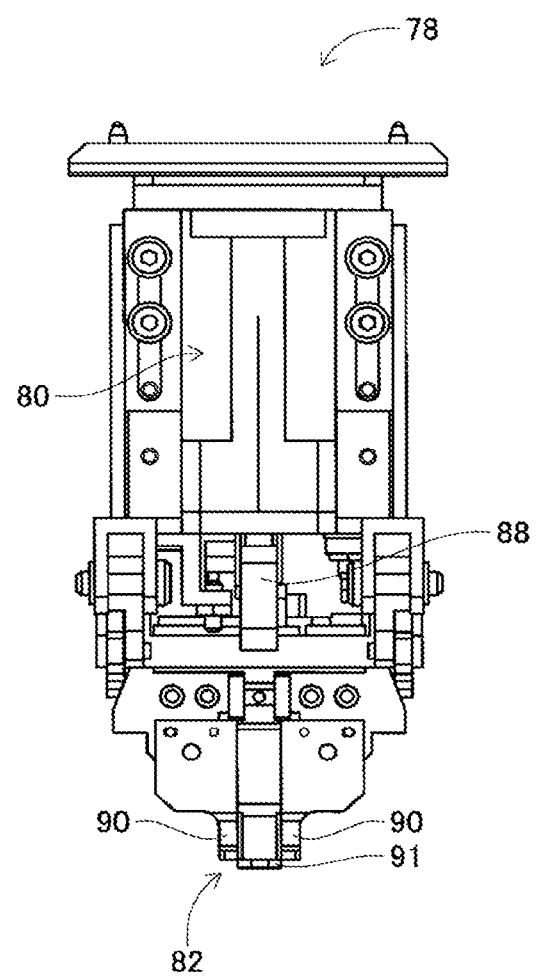
FIG. 4 is a front view showing the component holding tool.
Figure 5:
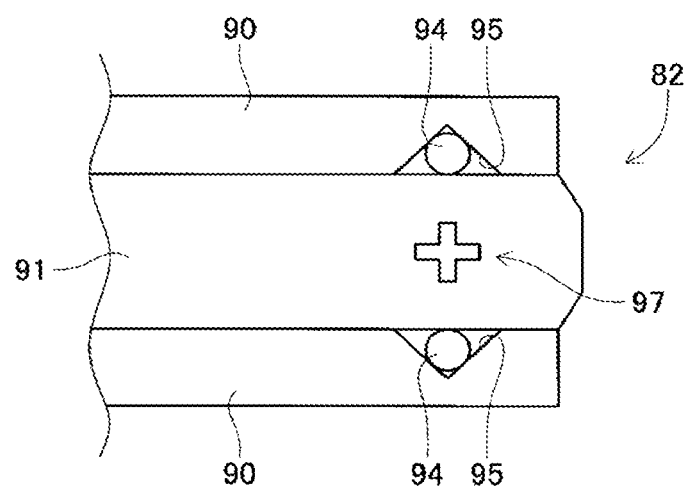
FIG. 5 is a view showing an arm section as viewed from below.
Figure 6:
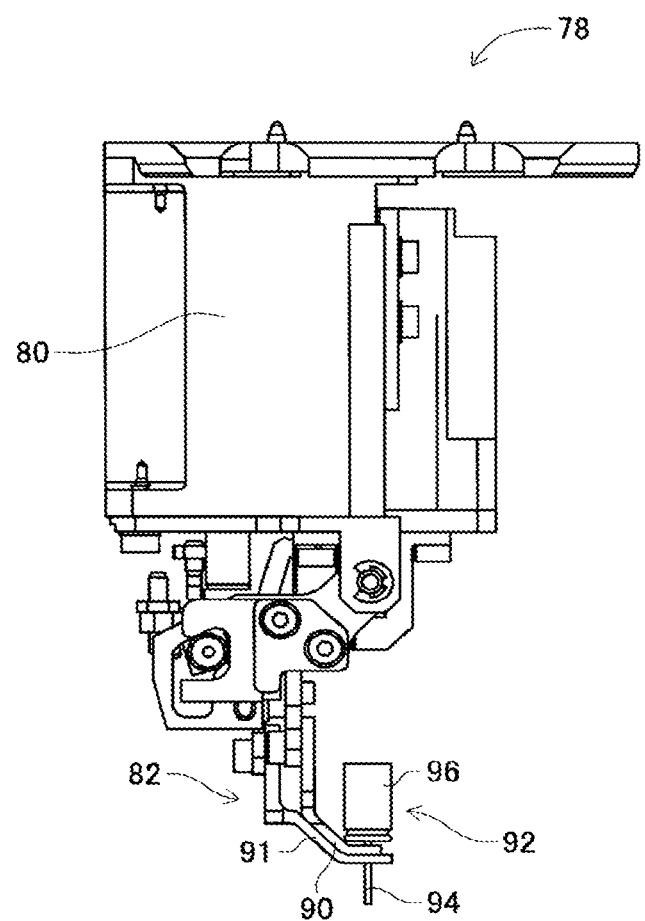
FIG. 6 is a side view showing the component holding tool.

Component holding tools 78 are individually attached to lower end faces of work heads 56, 58, as shown in FIG. 2. Component holding tool 78 is configured to hold a lead wire of a lead component and includes a main body section 80, arm section 82, opening and closing device (refer to FIG. 8), pusher 86, and air cylinder (refer to FIG. 8) 89, as shown in FIGS. 3 to 6. Incidentally, FIG. 3 is a side view of component holding tool 78, FIG. 4 is a front view of component holding tool 78, FIG. 5 is an enlarged view showing arm section 82 as viewed from below, and FIG. 6 is a side view of component holding tool 78 that is holding lead component 92.

Arm section 82 is comprised of a pair of claw sections 90 and auxiliary plate 91. The pair of claw sections 90 are held by main body section 80 so as to rock, and as opening and closing device 86 operates, distal ends of the pair of claw sections 90 move towards or away from each other while the pair of claw sections 90 are being caused to rock. Recessed section 95, which is sized according to the diameter of lead 94 of lead component 92 constituting a holding target, is formed on each inner side of the pair of claw sections 90. Auxiliary plate 91 is positioned between the pair of claw sections 90 and rocks together with the pair of claw sections 90. That is, the pair of claw sections 90 and auxiliary plate 91 rock between a state shown in FIG. 3 (hereinafter, also, referred to as a "releasing state" from time to time) and a state shown in FIG. 6 (hereinafter, also, referred to as a "holding state" from time to time). Then, auxiliary plate 91 enters between the pair of leads 94 of lead component 92, and the pair of claw sections 90 move towards auxiliary plate 91 as a result of the pair of claw sections 90 and auxiliary plate 91 rocking and moving towards the holding state. As this occurs, each pair of leads 94 of lead component 92 is sandwiched on both side surfaces by the recessed section on claw section 90 and auxiliary plate 91. As a result, as shown in FIG. 6, lead component 92 is held by arm section 82 at proximal ends of leads 94, that is, at ends of leads 94 which are situated nearer to component main body 96. Cross-like mark 97 is formed on a lower surface side of auxiliary plate 91. Mark 97 is formed at a portion on auxiliary plate 91 which is located intermediate between recessed sections 95 formed on the pair of claw sections 90 as the pair of claw sections 90 and auxiliary plate 91 move towards the holding state. Mark 97 may be other symbols of circular, triangular, and quadrangular shapes in addition to the cross-like shape.

Pusher 88 is held by main body section 80 so as to move in the up-down direction and is raised or lowered as air cylinder 89 operates. When lowered, pusher 88 is brought into contact with component main body 96 of lead component 92 held by arm section 82 to push lead component 92 downward. Holding of leads 94 by arm section 82 is released when lead component 92 is pushed downward by pusher 88. That is, arm section 82 is caused to move from the holding state towards the releasing state. Mark camera 26 is attached to slider 74 while being oriented downward as shown in FIG. 2 and is caused to move in the X-direction, Y-direction and Z-direction together with work head 56. As a result, mark camera 26 captures an image of an arbitrary position on frame section 40. Part camera 28 is disposed between substrate conveyance and holding device 22 and component supply device 30 on frame section 40 while being oriented upwards, as shown in FIG. 1. As a result, part camera 28 captures an image of a component held by component holding tools 78 of work heads 56, 58. Part camera 28 images a component using light shone from either a lateral light source or a vertical light source.

Figure 7:
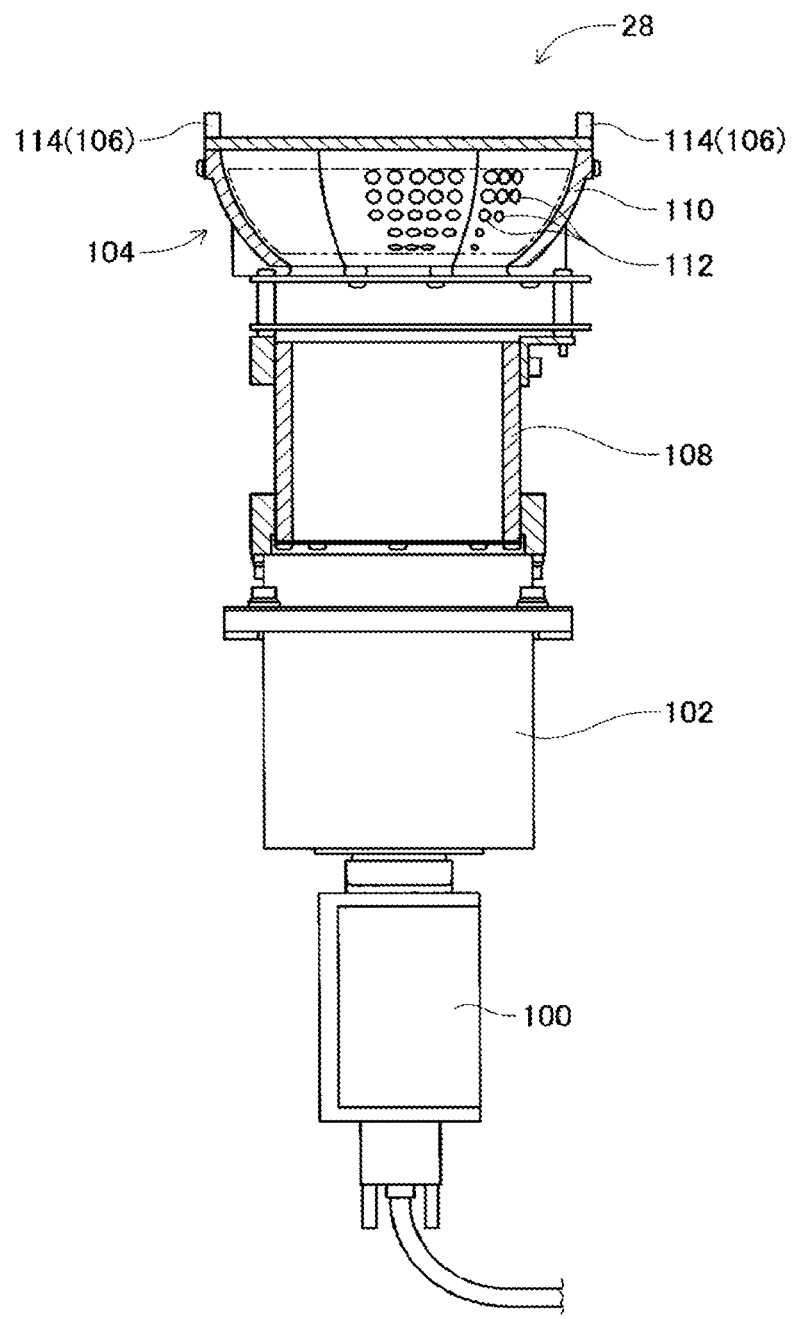
FIG. 7 is a schematic cross-sectional view showing a part camera.

Specifically, part camera 28 includes imaging device 100, lens 102, vertical lighting 104 and lateral lighting 106, as shown in FIG. 7. Imaging device 100 includes an imaging element (not shown) and is disposed with its light receiving plane oriented upwards. Lens 102 is fixed to a light receiving face, that is, an upper face of imaging device 100, and vertical lighting 104 is provided on top of lens 102 via box-shaped member 108. Vertical lighting 104 includes a generally annular outer shell member 110, and outer shell member 110 has a shape that extends upwards as it expands radially outwards. That is, outer shell member 110 has a shape of a bowl with a bottom section removed and is disposed at an upper end portion of box-shaped member 108 at an end portion thereof where the inner diameter gets smaller. Multiple LED lamps 112 are provided inside outer shell member 110, and multiple LED lamps 112 emit vertical light upwards of part camera 28.

Lateral lighting 106 is comprised of four laser lamps (in the figure, only two laser lamps are illustrated) 114. Four laser lamps 114 are disposed at four positions located equidistant from one another on the upper edge of outer shell member 110 of vertical lighting 104. Four laser lamps 114 shine lateral light in a substantially horizontal manner towards the center of the upper edge of outer shell member 110. Then, vertical light from vertical lighting 104 or lateral light from lateral lighting 106 reflects off an imaging target component and projects onto lens 102. Then, light that is projected onto lens 102 enters imaging device 100 to be detected by the imaging element of imaging device 100. As a result, part camera 28 obtains captured image data of the imaging target component.

Component supply device 30 is disposed at a first end portion of frame section 40 in the front-rear direction, as shown in FIG. 1. Component supply device 30 includes tray-type component supply device 116 and feeder-type component supply device (refer to FIG. 8) 118. Tray-type component supply device 116 constitutes a device configured to supply components while the components rest on a tray. Feeder-type component supply device 118 constitutes a device configured to supply components using a tape feeder or a stick feeder (not shown).

Bulk component supply device 32 is disposed at a second end portion of frame section 40 in the front-rear direction.

Bulk component supply device 32 constitutes a device configured to arrange multiple loosely dispersed components into alignment and supply the aligned components. That is, bulk component supply device 32 constitutes a device configured to arrange multiple components in random orientations into a predetermined orientation and supply the components in the predetermined orientation.

Components supplied by component supply device 30 and bulk component supply device 32 may include electronic circuit components, solar cell constituent components, power module constituent components, and the like. Electronic circuit components include components with or without leads.

Figure 8:
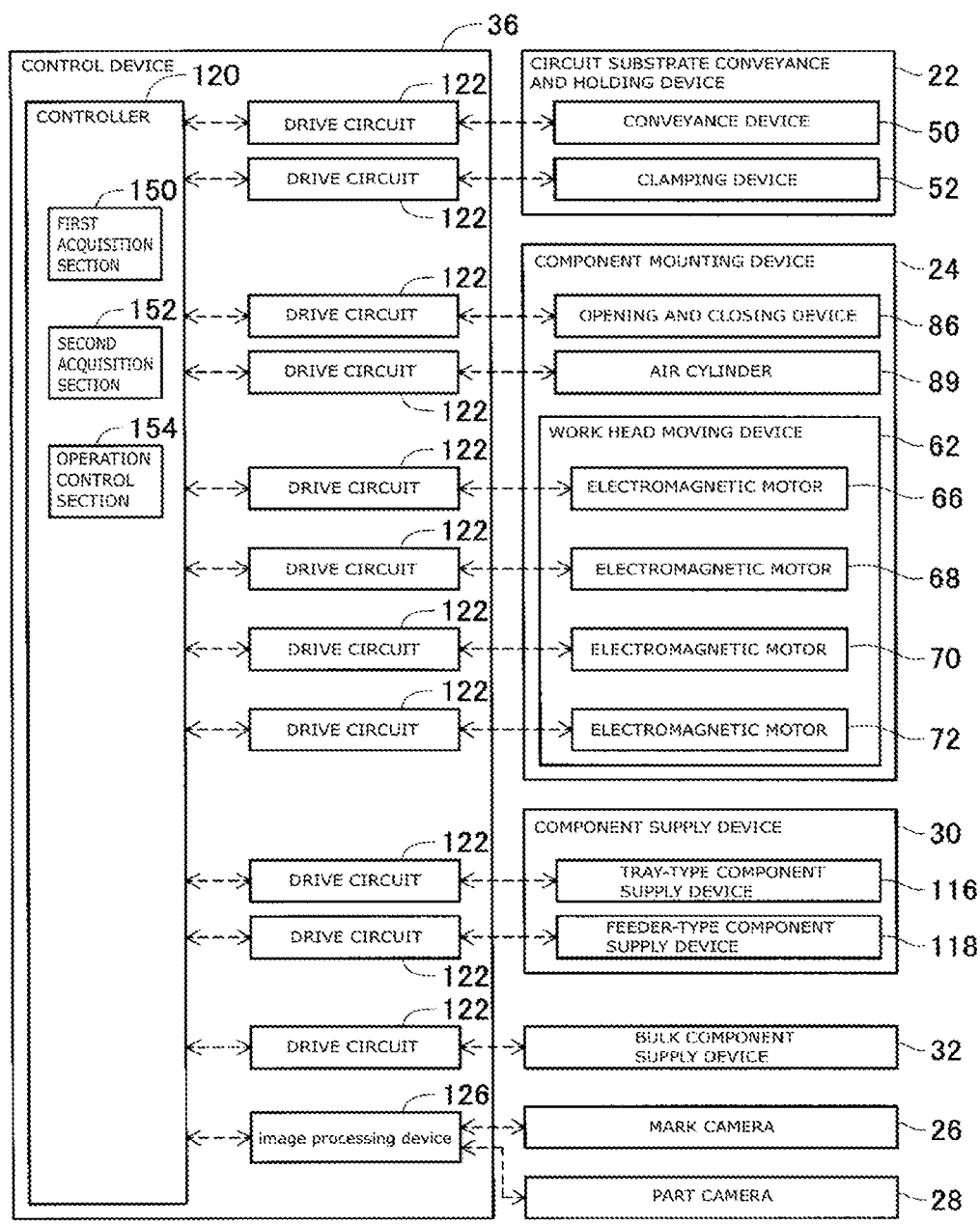
FIG. 8 is a block diagram showing a control device.

As shown in FIG. 8, control device 36 includes controller 120, multiple drive circuits 122, and image processing device 126. Multiple drive circuits 122 are connected to conveyance device 50, clamping device 52, electromagnetic motors 66, 68, 70, 72, opening and closing device 86, air cylinder 89, tray-type component supply device 116, feeder-type component supply device 118, and bulk component supply device 32. Controller 120 includes a CPU, a ROM, a RAM and the like and is mainly made up of a computer, connecting to multiple drive circuits 122. As a result, controller 120 controls operations of substrate conveyance and holding device 22, component mounting device 24, and the like. Controller 120 also connects to image processing device 126. Image processing device 126 is configured to process image data obtained by mark camera 26 and part camera 28, and controller 120 acquires various types of information from the image data.

(B) Operation of Component Mounter

In component mounter 10, mounting work is performed on circuit substrate 12 held on substrate conveyance and holding device 22 based on the configuration that has been described heretofore. In component mounter 10, although various types of components can be mounted on circuit substrate 12, mounting work of mounting lead components 92 on circuit substrate 12 will be described below.

Specifically, circuit substrate 12 is conveyed to a working position and is fixedly held by clamping device 52 in that working position. Next, mark camera 26 moves to stay above circuit substrate 12 and captures an image of circuit substrate 12. Then, controller 120 calculates information on the holding position of circuit substrate 12 and the like based on the captured image data. Component supply device 30 or bulk component supply device 32 supplies lead component 92 in a predetermined supply position. Then, either of work heads 56, 58 moves to stay above the component supply position, and component holding tool 78 holds lead component 92.

Next, when component holding tool 78 holds lead component 92, component holding tool 78 moves to stay above part camera 28, and an image of lead component 92 held by component holding tool 78 is captured by part camera 28. At this time, in part camera 28, lateral light is shone by lateral lighting 106, while no vertical light is shone by vertical lighting 104. Then, component holding tool 78, that is, work heads 56, 58 are moved so that lateral light shone by lateral lighting 106 is shone onto a distal end of lead 94 of lead component 92, whereby an image of the distal end of lead 94 is captured by part camera 28. Then, controller 120 calculates a positional coordinate of the distal end of lead 94 of lead component 92 in XY-directions based on the captured image data.

Subsequently, work head moving device 62 is controlled to operate so that a positional coordinate of a through hole (refer to FIG. 9) 130 formed in circuit substrate 12 in the XY-directions coincides with a positional coordinate of the distal end of lead 94 in the XY-directions. As a result, component holding tool 78 holding lead component 92 moves to stay above through hole 130 formed in circuit substrate 12, whereby through hole 130 coincides with the distal end of lead 94 in up-down direction.

Figure 9:
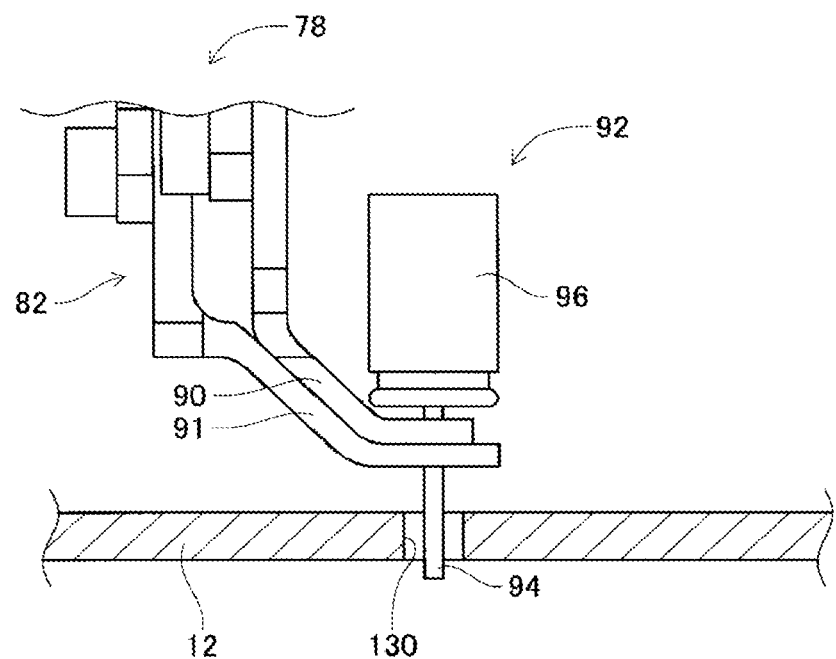
FIG. 9 is an operation diagram of the component holding tool when mounting a lead component.
Figure 10:
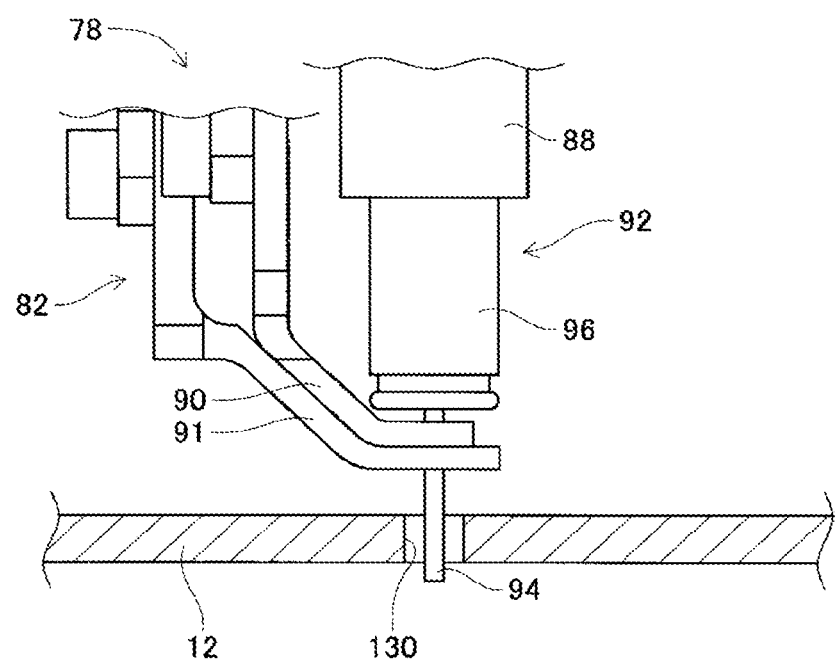
FIG. 10 is an operation diagram of the component holding tool when mounting the lead component.

Subsequently, work head moving device 62 is controlled to operate, so that component holding tool 78 holding lead component 92 is lowered. As a result, as shown in FIG. 9, the distal end of lead 94 of lead component 92 is inserted into through hole 130. Component holding tool 78 is lowered to a position where a distance between an upper surface of circuit substrate 12 and a lower end of arm section 82 of component holding tool 78 becomes a set distance and then stops. Next, air cylinder 89 is actuated, whereby pusher 88 is lowered, and as shown in FIG. 10, pusher 88 is brought into abutment with an upper surface of component main body 96 of lead component 92, whereby lead component 92 is pushed towards circuit substrate 12.

At this time, arm section 82 is caused to rock from the holding state towards the releasing state, and holding of lead 94 by arm section 92 is released. As a result, lead component 92 released from the holding by arm section 82 is pushed towards circuit substrate 12 by pusher 88, whereby lead 94 is inserted into through hole 130 until a lower surface of component main body 96 comes into an upper surface of circuit substrate 12. In this manner, in component mounter 10, lead component 92 held by component holding tool 78 is mounted on circuit substrate 12 with lead 94 kept inserted in through hole 130.

Figure 11:
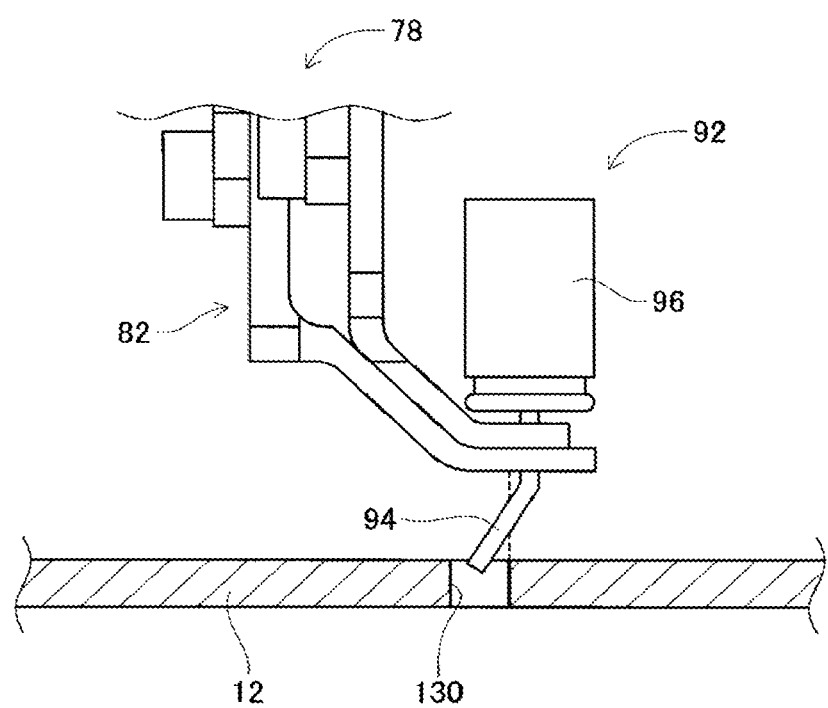
FIG. 11 is an operation diagram of the component holding tool when mounting a lead component.

However, there may be a case where lead 94 of lead component 92 is bent, and in such a case, although a distal end portion of lead 94 can be inserted into through hole 130, lead 94 cannot be inserted into through hole 130 as deep as a proximal end portion, that is, an end portion situated nearer to component main body 96, resulting in a case where lead component 92 cannot be mounted on circuit substrate 12 properly. Specifically, when mounting lead component 92 with lead 94 bent as shown in FIG. 11, as described above, component holding tool 78 is moved so that the distal end of lead 94 coincides with through hole 130 in the up-down direction, and therefore, the distal end portion of lead 94 can be inserted into through hole 130. However, when the proximal end portion of lead 94 is positioned outwards of an outer edge (indicated by a broken line) of through hole 130 in the up-down direction, lead 94 cannot be inserted into through hole 130 as deep as the proximal end portion thereof, whereby lead component 92 cannot be mounted on circuit substrate 12 properly.

In view of the case described above, in component mounter 10, a positional deviation amount between component holding tool 78 holding lead 94 and the distal end of lead 94 is measured, and in the case where the positional deviation amount so measured is a threshold or greater, no mounting work is performed. Specifically speaking, mark 97 is given on auxiliary plate 91 of component holding tool 78 as described above. Then, an image of mark 97 on auxiliary plate 91 of component holding tool 78 holding lead component 92 is captured by part camera 28 before or after an image of lead 94 of lead component 92 held by component holding tool 78 is captured by part camera 28.

The distal end of lead 94 is imaged using lateral light, while mark 97 on auxiliary plate 91 is imaged using vertical light. That is, when mark 97 is imaged, in part camera 28, vertical light is shone by vertical lighting 104, and no lateral light is shone by lateral lighting 106. Then, component holding tool 78, that is, work heads 56, 58 are moved so that vertical light shone by vertical lighting 104 is shone onto auxiliary plate 91 of component holding tool 78 holding lead component 92, and auxiliary plate 91 is imaged by part camera 28. Then, controller 120 calculates coordinates of the position of mark 97 given on auxiliary plate 91 in the XY-directions based on the captured image data.

As shown in FIG. 5, mark 97 is positioned intermediate between the pair of leads 94 with arm section 82 holding leads 94. Then, in the case where lead 94 is not bent but is straight, a distance between positional coordinates of mark 97 in the XY-directions and positional coordinates of the distal end of lead 94 in the XY-directions (hereinafter, also, referred to as a "spacing distance" from time to time) remains constant. However, arm section 82 of component holding tool 78 holds lead 94 in a position lying near the proximal end portion of lead 94, and in the case where lead 94 is bent, the positional coordinates of the distal end of lead 94 in the XY-directions deviate from positional coordinates of a proximal end of lead 94 in the XY-directions, and therefore, the spacing distance is increased.

Due to this, controller 120 calculates a spacing distance based on the positional coordinates of mark 97 in the XY-directions and the positional coordinates of the distal end of lead 94 in the XY-directions. Then, in the case where the calculated spacing distance is threshold X1 or greater, no mounting work is performed, and lead component 92 held by component holding tool 78 is discarded into a dust box (not shown). On the other hand, in the case where the spacing distance is smaller than threshold X1, mounting work is performed. Threshold X1 is determined based on the inner diameter of through hole 130, the diameter of lead 94, and the like.

Figure 12:
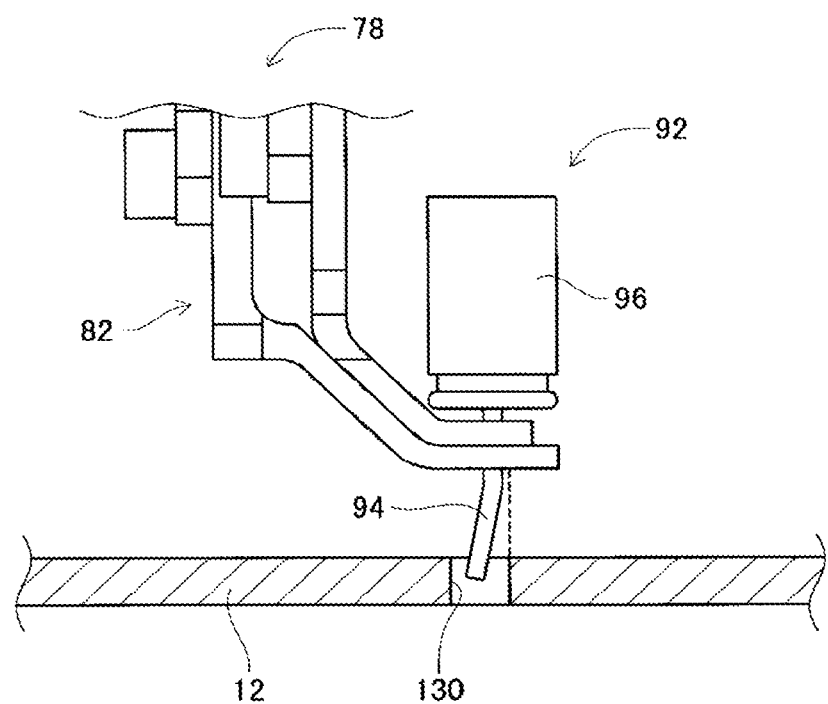
FIG. 12 is an operation diagram of the component holding tool when mounting the lead component.

According to this configuration, no mounting work is performed on lead component 92 when that particular lead component 92 is assumed not to be mounted properly on circuit substrate 12 due to lead 94 thereof being unable to be inserted into through hole 130 as deep as the proximal end portion thereof, whereas mounting work can be performed on lead component 92 only when that particular lead component 92 is assumed to be mounted properly on circuit substrate 12 due to lead 94 thereof being able to be inserted into through hole 130 as deep as the proximal end portion thereof. That is, for example, as shown in FIG. 11, in the case where lead 94 is bent, and an amount of bending of lead 94 is great, the spacing distance also becomes so great as to reach or exceed threshold X1. Due to this, lead component 92 of which the amount of bending of its lead is that great is not mounted. On the other hand, as shown in FIG. 12, in the case where although lead 94 is bent, an amount of bending of that particular lead 94 is small, the spacing distance is not increased much, and the spacing distance remains less than threshold X1. In this way, in the case where the spacing distance becomes less than threshold X1, since the proximal end portion of lead 94 is positioned inwards of an outer edge (indicated by a broken line) of through hole 130 in the up-down direction, mounting work is performed on lead component 92 of which a bending amount of its lead is small. As a result, it is possible to exclude only lead components 92 that are assumed not to be mounted properly from a list of mounting operation target lead components.

However, even though the spacing distance is less than threshold X1, since lead component 92 is held by arm section 82 at lead 94 when lead component 92 is mounted, that is, since lead 94 is held by arm section 82 below component main body 96 of lead component 92, there are fears that arm section 82 is brought into abutment with a component that is previously mounted on circuit substrate 12, whereby arm section 82 is broken or fails.

Figure 13:
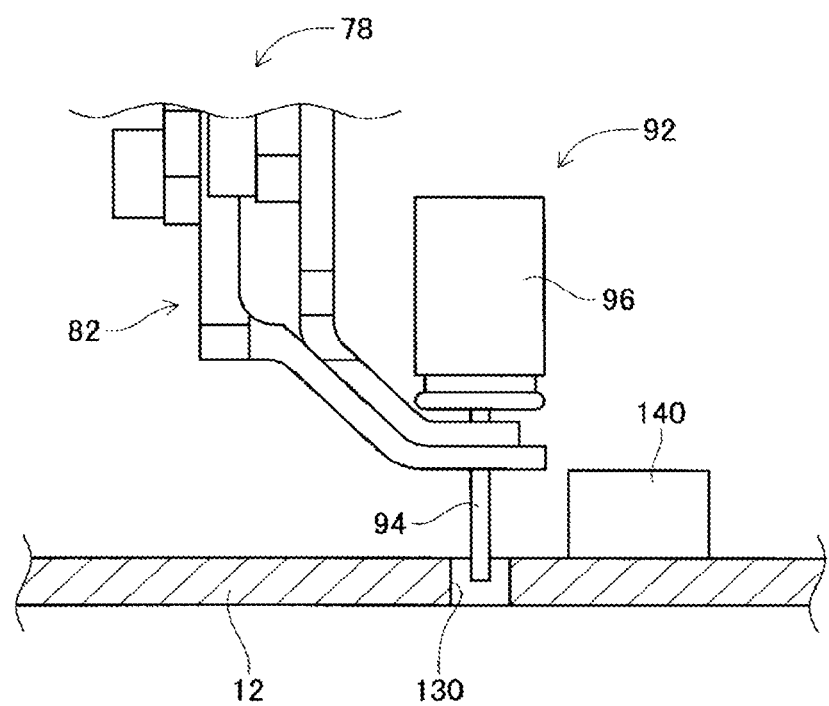
FIG. 13 is an operation diagram of the component holding tool when mounting a lead component.
Figure 14:
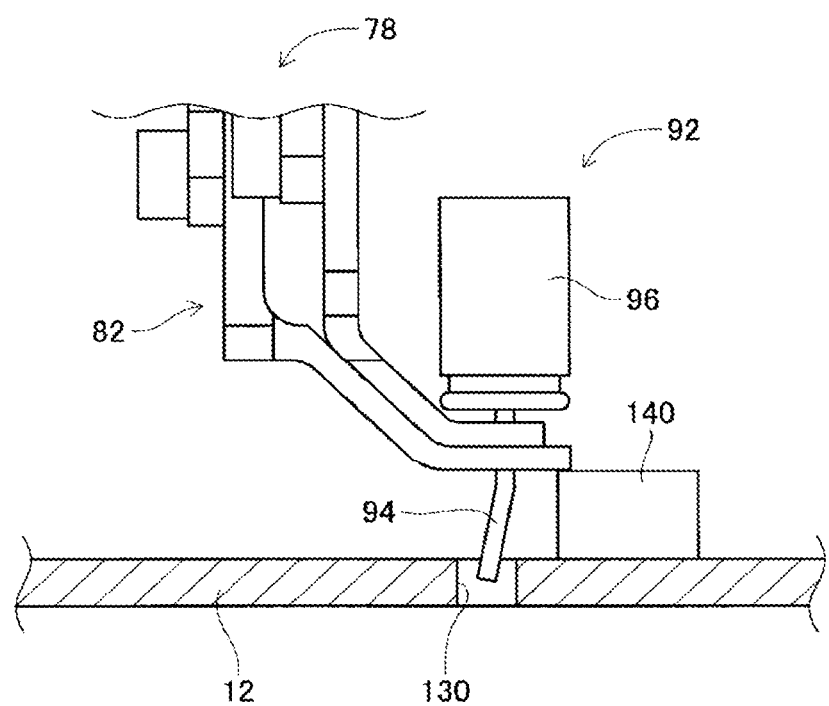
FIG. 14 is an operation diagram of the component holding tool when mounting a lead component.

Specifically, as shown in FIG. 13, there may be a case where there exists near a designed mounting position of lead component 92 component 140 that is mounted before that particular lead component 92 is mounted (hereinafter, referred to as a "previously-attached component" from time to time). In such a case, in the case where lead 94 is not bent but is straight, mounting work can be performed without arm section 82 being brought into abutment with previously-attached component 140. However, as shown in FIG. 14, in the case where lead 94 is bent, component holding tool 78 is moved to make positional coordinates of the distal end of lead 94 in the XY-directions coincide with positional coordinates of through hole 130 in the XY-directions. At this time, compared with a case where lead 94 is straight, arm section 82 is offset in a direction in which arm section 82 approaches previously-attached component 140 by an amount corresponding to a difference between positional coordinates of the distal end of lead 94 in the XY-directions and positional coordinates of a proximal end of lead 94 in the XY-directions. As a result, there are fears that arm section 82 is brought into abutment with previously-attached component 140 when component holding tool 78 is lowered. In such a case, to prevent the failure of previously-attached component 140 or circuit substrate 12, the breaking strength of arm section 82 is set low. Due to this, when arm section 82 is brought into abutment with previously-attached component 140, arm section 82 fails before previously-attached component 140 or the like fails, whereby the failure of previously-attached component 140 or the like is prevented. However, when arm section 82 fails, arm section 82 exchanging becomes necessary, thereby deteriorating production capability.

In view of the problem described above, in component mounter 10, even though the spacing distance is smaller than threshold X1, in the case where previously-attached component 140 exists near a designed mounting position of a component held by component holding tool 78, it is determined whether the spacing distance is equal to or greater than threshold X2 that is set at a value smaller than that of threshold X1. Then, when it is determined that the spacing distance is equal to or greater than threshold X2, no mounting work is performed, and lead component 92 held by component holding tool 78 is discarded into a dust box (not shown). On the other hand, when the spacing distance is smaller than threshold X2, mounting work is performed. Threshold X2 is determined based on a distance between a designed mounting position and previously-attached component 140.

Figure 15:
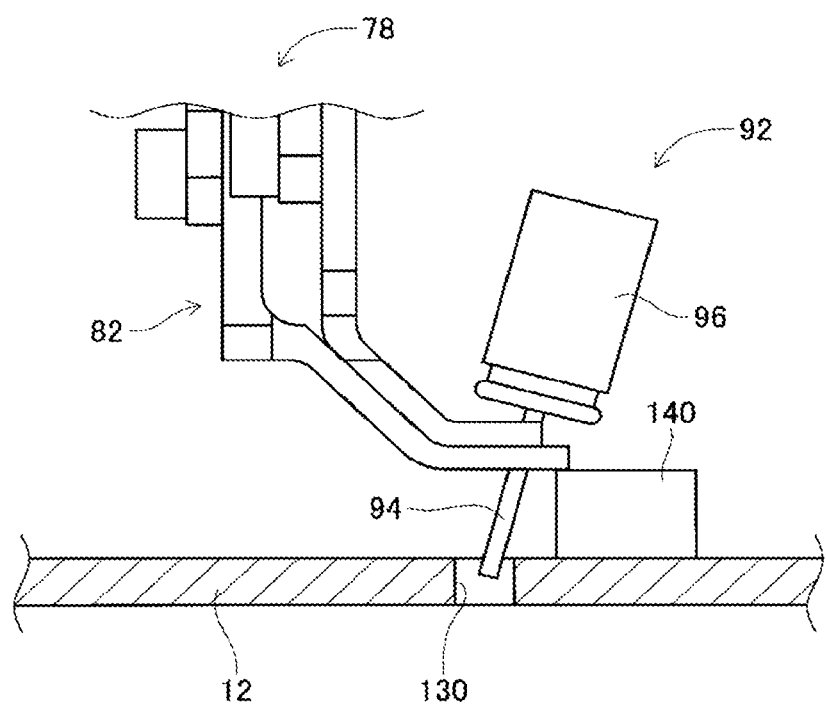
FIG. 15 is an operation diagram of the component holding tool when mounting a lead component.

As a result, no mounting work is performed on lead component 92 that is more likely to bring arm section 82 into abutment with previously-attached component 140 when mounting work is performed, whereas mounting work can be performed only on lead component 92 that is less likely to bring arm section 82 into abutment with previously-attached component 140 when mounting work is performed. In the above description, although the case is described where lead 94 is bent, as shown in FIG. 15, in the case where lead 94 is held by component holding tool 78 while being inclined, too, there are fears that mounting work cannot be performed properly and that arm section 82 is brought into abutment with previously-attached component 140, in which case, too, by applying the approach described above, similar working effects can be provided.

In this way, in component mounter 10, in the case where previously-attached component 140 does not exist in the designed mounting position, mounting work can be performed properly in an ensured fashion by determining whether the spacing distance is threshold X1 or greater, whereas in the case where previously-attached component 140 exists in the designed mounting position, the abutment of arm section 82 with previously-attached component 140 can be prevented by determining whether the spacing distance is threshold X2 or greater. As described above, threshold X1 is determined based on the inner diameter of through hole 130, the diameter of lead 94, or the like, and threshold X2 is determined based on the distance between the designed mounting position and previously-attached component 140. Due to this, thresholds X1, X2 are set for each of lead components 92 that are to be mounted on circuit substrates 12.

As shown in FIG. 8, controller 120 of control device 36 includes first acquisition section 150, second acquisition section 152, and operation control section 154. First acquisition section 150 constitutes a functional section configured to acquire positional coordinates of the distal end position of lead 94 in the XY-directions based on captured image data of lead 94. Second acquisition section 152 constitutes a functional section configured to acquire positional coordinates of mark 97 in the XY-directions based on captured image data of auxiliary plate 91 of arm section 82. Operation control section 154 constitutes a functional section configured to perform mounting work when the spacing distance is smaller than the threshold and not to perform mounting work when the spacing distance is the threshold or greater.

Second Embodiment

Figure 16:
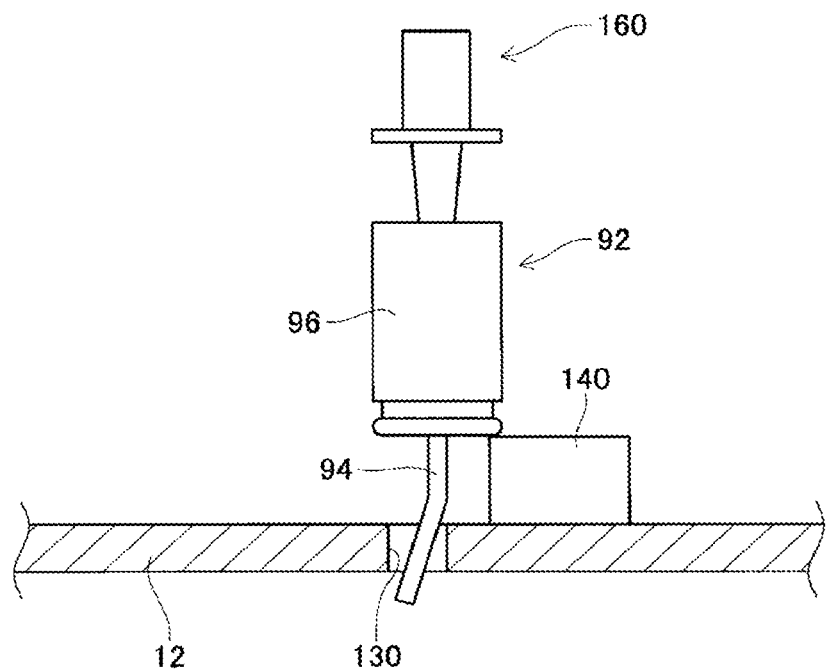
FIG. 16 is an operation diagram of a component holding tool when mounting a lead component according to a second embodiment.

In the first embodiment, lead 94 of lead component 92 is described as being held by component holding tool 78; however, in a second embodiment, as shown in FIG. 16, component main body 96 of lead component 92 is held by a suction nozzle 160. In this way, in the case where component main body 96 is held by suction nozzle 160, since suction nozzle 160 cannot be seen from a lower surface side thereof, positional coordinates of suction nozzle 160 in the XY-directions cannot be acquired based on image data captured by part camera 28. Due to this, in the second embodiment, positional coordinates of component main body 96 in the XY-directions are acquired, and whether mounting work is performed or not performed is determined by making use of the acquired positional coordinates.

Figure 17:
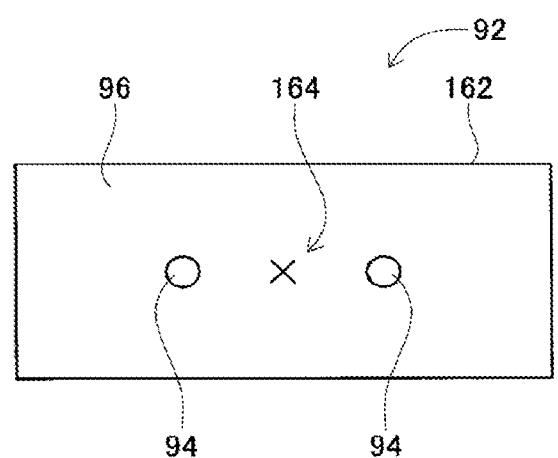
FIG. 17 is a schematic diagram showing a bottom surface side of a component main body of a lead component.

To describe this in detail, in the case of lead component 92 held by suction nozzle 160, too, as with the first embodiment, an image of lead 94 is captured using lateral light of part camera 28, and positional coordinates of a distal end of lead 94 are calculated based on the captured image data. An image of component main body 96 of lead component 92 held by suction nozzle 160 is captured using vertical light of part camera 28 before or after the image of lead 94 is captured using the lateral light. As a result, an image of the lower surface side of component main body 96 is obtained. Then, as shown in FIG. 17, outer edge 162 of component main body 96 is specified based on the captured image data, and center point 164 of outer edge 162 is calculated as positional coordinates of component main body 96 in the XY-directions. In FIG. 17, although center point 164 is illustrated, center point 164 is so illustrated as to facilitate the description and is not shown on actual component main body 96.

Next, controller 120 calculates a spacing distance between the positional coordinates of the distal end of lead 94 in the XY-directions and the positional coordinates of component main body 96 in the XY-directions (the positional coordinates of center point 164 in the XY-directions). Then, in the case where previously-attached component 140 does not exist in a designed mounting position, it is determined whether the spacing distance is threshold X1 or greater, whereas in the case where previously-attached component 140 exists in the designed mounting position, it is determined whether the spacing distance is threshold X2 or greater. As a result, the same working effects as those provided in the first embodiment can be provided in the second embodiment, too.

Component mounter 10 constitutes an example of an operation machine. Part camera 28 constitutes an example of an imaging device. Control device 36 constitutes an example of a control device. Work heads 56 and 58 constitute examples of a holding head. Work head moving device 62 constitutes an example of a moving device. Component holder 78 constitutes an example of a holding tool. Lead component 92 constitutes an example of a lead component. Lead 94 constitutes an example of a lead. Component body 96 constitutes an example of a body. Mark 97 constitutes an example of a target object. Through hole 130 constitutes an example of a through hole. Mark 97 constitutes an example of a target object. First acquisition section 150 constitutes an example of a first acquisition section. Second acquisition unit 152 constitutes an example of a second acquisition unit.

Figure 18:
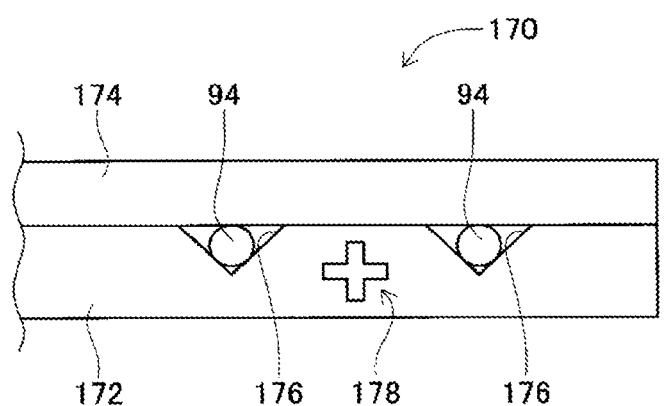
FIG. 18 is a view showing an arm section of a modified example as viewed from below.

In addition, the present disclosure is not limited to the embodiments described above and can be carried out in various modes in which various modifications and improvements are made to the embodiments based on the knowledge of those skilled in the art to which the present disclosure pertains. Specifically, for example, in the first embodiment, arm section 82 is adopted which has the structure of gripping lead 94 using the pair of claw sections 90 and auxiliary plate 91; however, arm section 170 can be adopted which has a structure shown in FIG. 18. Arm section 170 is comprised of first arm 172 and second arm 174, and first arm 172 rocks in such a manner as to move towards or away from second arm 174. A pair of recessed sections 176, matching in size the diameter of leads 94 of mounting target lead component 92, are formed on a surface of first arm 172 that faces second arm 174. Then, first arm 172 moves towards second arm 174, whereby the pair of leads 94 of lead component 92 are both held by recessed sections 176 of first arm 172 and second arm 174 therebetween on both sides thereof. As a result, lead component 92 is held by arm section 170 at leads 94. Cross-shaped mark 178 is formed in an intermediate position between the pair of recessed sections 176 on a lower surface side of first arm 172. Then, positional coordinates of mark 178 in the XY-directions may be calculated based on captured image data, so that whether mounting work is performed or not performed is determined by making use of the calculated positional coordinates.

In the above embodiment, although the positional coordinates of mark 97 in the XY-directions and the positional coordinates of the distal end of lead 94 in the XY-directions are calculated based on the captured image data, they may be detected using sensors or the like.

In the first embodiment, mark 97 is given on arm section 82, and the positional coordinates of mark 97 are calculated; however, positional coordinates of existing part of arm section 82, for example, recessed sections 95 or the like may be calculated. In the second embodiment, the outer edge of component main body 96 is specified, and the positional coordinates of center point 164 are calculated; however, a mark or the like may be formed on component main body 96, so that positional coordinates of the mark are calculated.

REFERENCE SIGNS LIST

10: component mounter (operation machine), 28: part camera (imaging device), 36: control device, 56: work head (holding head), 58: work head (holding head), 62: work head moving device (moving device), 78: component holding tool (holding tool), 92: lead component, 94: lead, 96: component main body (body), 97: mark (target object), 130: through hole, 150: first acquisition section, 152: second acquisition section

The invention claimed is:

1. An operation machine comprising:
a holding head including a holding tool configured to hold a lead of a lead component comprised of the lead and a body;
a moving device configured to move the holding head;
an imaging device configured to capture an image of the lead component and a reference mark on a lower surface of the holding tool;
a first acquisition section configured to acquire a distal end position of the lead of the lead component held by the holding tool based on captured image;
a second acquisition section configured to acquire at least one of a position of the holding tool holding the lead of the lead component and a position of the body of the lead component held by the holding tool based on captured image; and
a control device configured to control operations of the holding head and the moving device to perform insertion work of inserting the lead of the lead component held by the holding tool into a through hole formed in a board when a distance between a position acquired by the first acquisition section and a position acquired by the second acquisition section is smaller than a threshold and not to perform the insertion work when the distance is equal to or greater than the threshold.

2. The operation machine according to claim 1, comprising:
the second acquisition section configured to acquire a position of the holding tool that is holding the lead of the lead component based on captured image data of the holding tool.

3. The operation machine according to claim 1, comprising:
the second acquisition section configured to acquire a position of the body of the lead component held by the holding tool based on captured image data of the body.

4. The operation machine according to claim 1,
wherein the second acquisition section acquires at least one of a position of a target object provided on the holding tool and a position of a target object provided on the body.

5. The operation machine according to claim 1,
wherein the threshold is set for each of the lead components constituting target components of the insertion work.

6. The operation machine according to claim 1,
wherein the holding tool includes a pair of claw sections and an auxiliary plate, the pair of claw sections movable relative to the auxiliary plate, and
wherein the lead of the lead component is held between the pair of claw sections and the auxiliary plate.

7. The operation machine according to claim 6,
wherein the reference mark is on a lower surface of the auxiliary plate.

8. The operation machine according to claim 7,
wherein the second acquisition section determines a spatial distance between the distal end position of the lead and the reference mark.

9. The operation machine according to claim 1,
wherein the distal end of lead is imaged with the imaging device using a lateral light and the reference mark is imaged with the imaging device using a vertical light.

\* \* \* \* \*